(12) United States Patent
Oishi et al.

(10) Patent No.: US 8,357,322 B2
(45) Date of Patent: Jan. 22, 2013

(54) PROCESS AND APPARATUS FOR PRODUCTION OF COLORLESS TRANSPARENT RESIN FILM

(75) Inventors: Jitsuo Oishi, Kanagawa (JP); Sotaro Hiramatsu, Kanagawa (JP); Shuta Kihara, Kanagawa (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 135 days.

(21) Appl. No.: 12/622,932

(22) Filed: Nov. 20, 2009

(65) Prior Publication Data
US 2010/0187719 A1    Jul. 29, 2010

Related U.S. Application Data

(63) Continuation of application No. PCT/JP2008/059122, filed on May 19, 2008.

(30) Foreign Application Priority Data

May 24, 2007    (JP) .................................. 2007-138074

(51) Int. Cl.
B29D 7/00    (2006.01)

(52) U.S. Cl. ..................................................... 264/216

(58) Field of Classification Search .................... 264/216
See application file for complete search history.

(56) References Cited

U.S. PATENT DOCUMENTS 3,639,343 A    2/1972 Su
(Continued)

FOREIGN PATENT DOCUMENTS

JP    8-143666    6/1996
JP    8-225645    9/1996
(Continued)

OTHER PUBLICATIONS

Search report from E.P.O. that issued with respect to patent family member European Patent Application No. 08752942.6, mail date is Aug. 23, 2011.

(Continued)

Primary Examiner — Larry Thrower
(74) Attorney, Agent, or Firm — Greenblum & Bernstein, P.L.C.

(57) ABSTRACT

A method for producing a colorless transparent resin film by a solution flow casting method containing: flow-casting an organic solvent solution of a polyamic acid or a polyimide on a support; and drying, the method containing at least the following step (1), step (2) and step (3) in this order, and an apparatus therefor:

(1) a step of flow-casting an organic solvent solution of a polyamic acid or polyamide on a support, (2) a step of evaporating the organic solvent while blowing a gas having an oxygen content of from 0.001 to 15% by volume at a temperature of from 100 to 170° C. onto the flow-cast material, and releasing as a self-supporting film from the support, and (3) a step of performing the following step (3-1) and step (3-2) in this order:

(3-1) a step of lowering a residual ratio of the organic solvent in the self-supporting film while blowing a gas having an oxygen content of 15% by volume or less at a temperature of from 100 to 250° C. onto the film by using at least one dryer of a type of blowing a heated gas, and (3-2) a step of lowering the residual ratio of the organic solvent in the self-supporting film while blowing a gas having an oxygen content of 5% by volume or less at a temperature of from 150 to 400° C. onto the film by using at least one dryer of a type of blowing a heated gas.

14 Claims, 1 Drawing Sheet

U.S. PATENT DOCUMENTS

| | | | |
|---|---|---|---|
| 4,725,484 A | 2/1988 | Kumagawa et al. | |
| 5,308,569 A | 5/1994 | Hamamoto et al. | |
| 2004/0063898 A1* | 4/2004 | Nishinaka et al. | 528/332 |
| 2006/0105185 A1* | 5/2006 | Hwang et al. | 428/473.5 |

FOREIGN PATENT DOCUMENTS

| | | |
|---|---|---|
| JP | 11-005226 | 1/1999 |
| JP | 2002-350644 | 12/2002 |
| JP | 2006-103145 | 4/2006 |
| JP | 2006-143839 | 6/2006 |
| JP | 2007-42593 | 2/2007 |

OTHER PUBLICATIONS

International Search Report dated Aug. 12, 2008 that issued with respect to PCT/JP2008/059122.

* cited by examiner

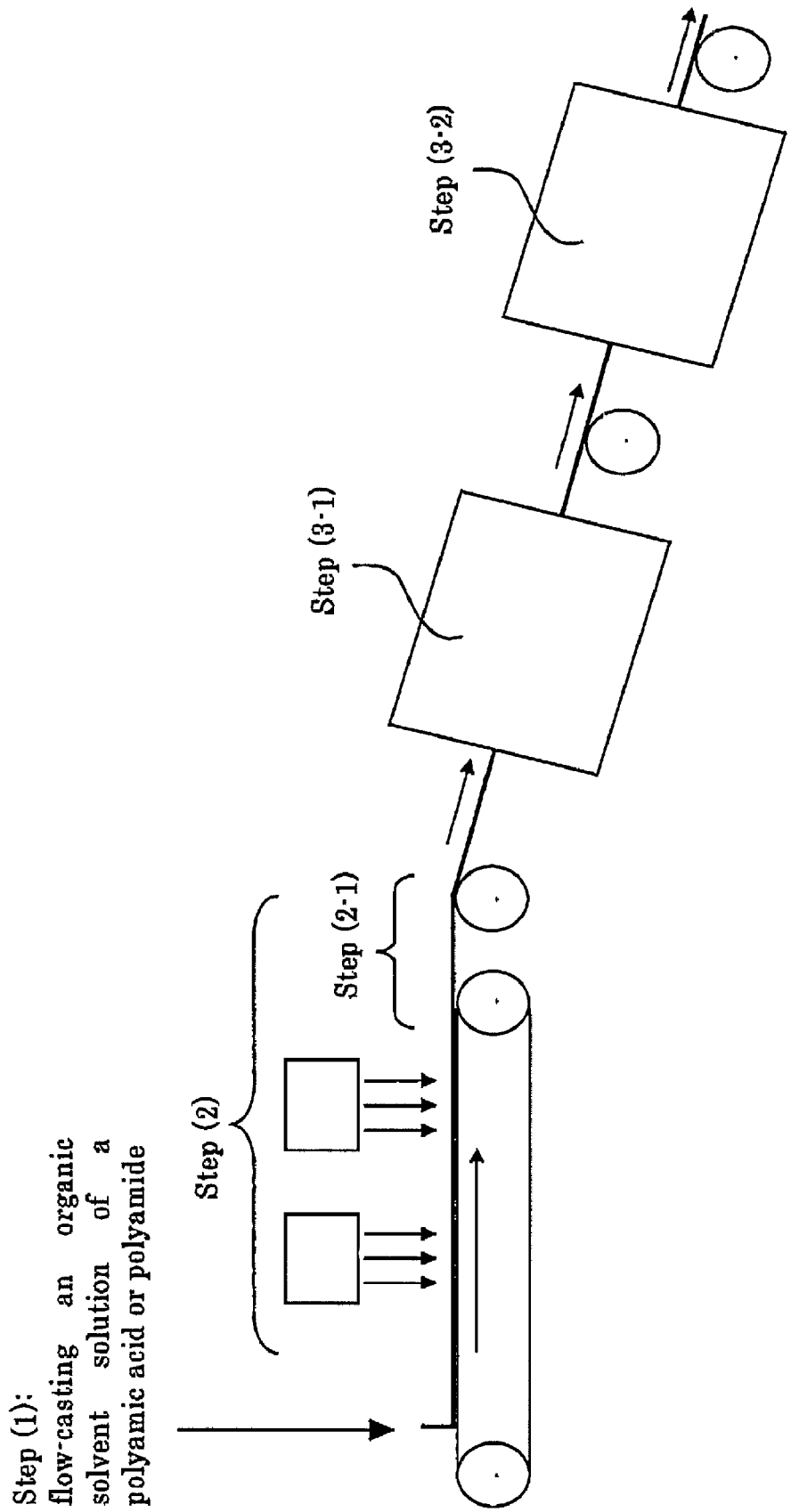

PROCESS AND APPARATUS FOR PRODUCTION OF COLORLESS TRANSPARENT RESIN FILM

CROSS REFERENCE TO RELATED APPLICATION

This application is a continuation of PCT International Application No. PCT/JP2008/059122, filed May 19, 2008, which is hereby incorporated by reference as though set forth in full herein.

TECHNICAL FIELD

The present invention relates to a production method of a colorless transparent resin film containing a polyamic acid or a polyimide that is excellent in colorless transparency, heat resistance and flatness, and a production apparatus for the resin film. The colorless transparent resin film is utilized as a transparent substrate, a thin film transistor substrate and a flexible printed circuit substrate of a liquid crystal display device and an organic EL display device, and the like.

BACKGROUND ART

Production methods of resin films mainly include a melt-extrusion molding method, a solution flow casting method, a calendering method and the like. The solution flow casting method among these is such a method that a solution having a resin dissolved in a solvent (a solvent solution of the resin) is flow-cast on a support, such as a drum and a belt, and the solvent in the solvent solution is evaporated by drying to provide a resin film. In the solution flow casting method, the film does not receive a physical force to provide such characteristics that the polymer is difficult to suffer orientation to prevent directionality from occurring in strength and optical characteristics, and thus the method is suitable for producing a resin for optical purposes. However, it is necessary to expose the solution to a high temperature exceeding 240° C. upon evaporating the solvent by drying in some kinds of solvents, and the resulting resin film suffers decrease in total light transmittance and increase in haze depending on the kind of the resin, which become a significant problem in optical purposes.

Polymethyl methacrylate, which has been used as optical plastics, has low birefringence and colorless transparency, but is insufficient in heat resistance and thus cannot be applied to an optical purpose where high heat resistance is required. Polycarbonate has a relatively high glass transition temperature, but cannot be applied thereto since it does not necessarily satisfy heat resistance that is required in an optical purpose and has large birefringence.

It is known that a polyimide has high heat resistance. An ordinary polyimide is obtained from an aromatic tetracarboxylic anhydride and an aromatic diamine and is excellent in heat resistance, chemical resistance, mechanical property and electric characteristics owing to the rigidity of the molecule, the resonance stability and the strong chemical bond, and therefore it is widely used in such fields as molded articles, composite materials, electric and electronic members and the like. In addition, a polyimide capable of being melted under heat using 1,2,4,5-cyclohexanetetracarboxylic anhydride and a reactive derivative thereof (see Patent Document 1) and a colorless transparent polyimide obtained by decoloration (see Patent Documents 2 and 3) have been also developed.

[Patent Document 1] U.S. Pat. No. 3,639,343
[Patent Document 2] JP-A-8-143666
[Patent Document 3] JP-A-8-225645

DISCLOSURE OF THE INVENTION

Problems to be Solved by the Invention

However, the conventional production methods of polyimide (see, for example, Patent Documents 1 to 3) is difficult to provide stably a polyimide having high colorless transparency.

Accordingly, an object of the present invention is to solve the problems, thereby providing a production method of a colorless transparent resin film that has high colorless transparency and is excellent in heat resistance and flatness, and providing a production apparatus of the resin film.

BRIEF DESCRIPTION OF THE DRAWING

The present invention is further described in the detailed description which follows, in reference to the noted plurality of drawings by way of non-limiting examples of exemplary embodiments of the present invention, in which like reference numerals represent similar parts throughout the drawing, and wherein:

The FIGURE illustrates a graphical representation of an exemplary method and apparatus for carrying out the invention.

MEANS FOR SOLVING THE PROBLEMS

As a result of earnest investigations made by the inventors for achieving the object, it has been found that a resin film having high colorless transparency can be obtained by a solution flow casting method that includes a particular drying step, and thus the present invention has been completed.

Accordingly, the present invention relates to [1] a method for producing a colorless transparent resin film by a solution flow casting method containing: flow-casting an organic solvent solution of a polyamic acid or a polyimide on a support; and drying, the method containing at least the following step (1), step (2) and step (3) in this order:

(1) a step of flow-casting an organic solvent solution of a polyamic acid or polyamide on a support, (2) a step of evaporating the organic solvent while blowing a gas having an oxygen content of from 0.001 to 15% by volume at a temperature of from 100 to 170° C. onto the flow-cast material, and releasing as a self-supporting film from the support, and (3) a step of performing the following step (3-1) and step (3-2) in this order:

(3-1) a step of lowering a residual ratio of the organic solvent in the self-supporting film while blowing a gas having an oxygen content of 15% by volume or less at a temperature of from 100 to 250° C. onto the film by using at least one dryer of a type of blowing a heated gas, and (3-2) a step of lowering the residual ratio of the organic solvent in the self-supporting film while blowing a gas having an oxygen content of 5% by volume or less at a temperature of from 150 to 400° C. onto the film by using at least one dryer of a type of blowing a heated gas.

The present invention also relates to [2] a production apparatus of a colorless transparent resin film having a total light transmittance of 88% or more, a YI (yellow index) of 3 or less and a haze of 1.5 or less by a solution flow casting method, the apparatus containing:

a film forming device (2) that blows a gas having an oxygen content of from 0.001 to 15% by volume at a temperature of from 100 to 170° C. onto an organic solvent solution of a polyamic acid or a polyimide having been flow-cast on a support, thereby providing a self-supporting film, a device (2-1) that releases the self-supporting film from the support, a dryer (3-1) of a type of blowing a gas having an oxygen content of 15% by volume or less at a temperature of from 100 to 250° C., and a dryer (3-2) of a type of blowing a gas having an oxygen content of 5% by volume or less at a temperature of from 150 to 400° C.

ADVANTAGES OF THE INVENTION

According to the present invention, such a resin film can be obtained that has high colorless transparency (with a total light transmittance of 88% or more, a YI (yellow index) of 3 or less and a haze of 1.5 or less) and is excellent in heat resistance and flatness. The colorless transparent resin film is effectively utilized as a transparent substrate, a thin film transistor substrate and a flexible printed circuit substrate of a liquid crystal display device and an organic EL display device, and the like.

BEST MODE FOR CARRYING OUT THE INVENTION

The present invention is, as described above, a production method of a colorless transparent resin film containing: flow-casting an organic solvent solution of a polyamic acid or a polyimide on a support; and drying, in which the method contains at least the aforementioned step (1), step (2) and step (3) in this order.

Step (1)

The step (1) is a step of flow-casting an organic solvent solution of a polyamic acid or a polyimide on a support. Preferred examples of the polyamic acid or the polyimide used in the step (1) include a polyimide having a repeating unit represented by the following general formula (I) (which is hereinafter referred to as a polyimide (A)) or a polyamic acid having a repeating unit represented by the following general formula (I') (which is hereinafter referred to as a polyamic acid (A')).

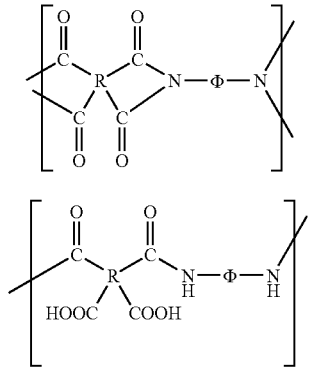

In the formulae, R represents a tetravalent aliphatic hydrocarbon group or a tetravalent alicyclic hydrocarbon group each having from 4 to 39 carbon atoms. Φ represents a divalent aliphatic hydrocarbon group, a divalent alicyclic hydrocarbon group, a divalent aromatic hydrocarbon group or a divalent group containing a combination of these groups, each of which has from 2 to 39 carbon atoms, and may contain as a bonding group at least one group selected from the group consisting of —O—, —SO$_2$—, —CO—, —CH$_2$—, —C(CH$_3$)$_2$—, —OSi(CH$_3$)$_2$—, —C$_2$H$_4$O— and —S—.

Examples of the tetravalent aliphatic hydrocarbon group having from 4 to 39 carbon atoms represented by R include a butan-1,1,4,4-triyl group, an octan-1,1,8,8-triyl group and a decan-1,1,10,10-triyl group.

Examples of the tetravalent alicyclic hydrocarbon group having from 4 to 39 carbon atoms represented by R include a cyclobutan-1,2,3,4-tetrayl group, a cyclopentan-1,2,4,5-tetrayl group, a cyclohexan-1,2,4,5-tetrayl group, a bicyclo[2.2.2]oct-7-en-2,3,5,6-tetrayl group, a bicyclo[2.2.2]octan-2,3,5,6-tetrayl group, a 3,3',4,4'-dicyclohexyltetrayl group, a 3,6-dimethylcyclohexan-1,2,4,5-tetrayl group and a 3,6-diphenylcyclohexan-1,2,4,5-tetrayl group.

Examples of the divalent aliphatic hydrocarbon group having from 2 to 39 carbon atoms, which has or does not have the bonding group, represented by Φ include groups represented by the following structural formulae.

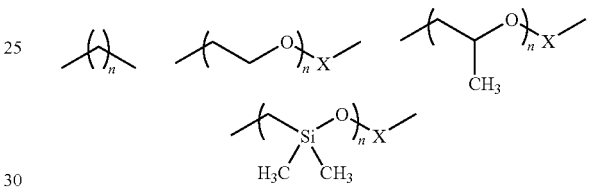

In the structural formulae, n represents the number of repeating units, and is preferably from 1 to 5, and more preferably from 1 to 3. X represents an alkandiyl group having from 1 to 3 carbon atoms, i.e., a methylene group, an ethylene group, a trimethylene group or a propan-1,2-diyl group, and preferably a methylene group.

Examples of the divalent alicyclic hydrocarbon group having from 2 to 39 carbon atoms, which has or does not have the bonding group, represented by Φ include groups represented by the following structural formulae.

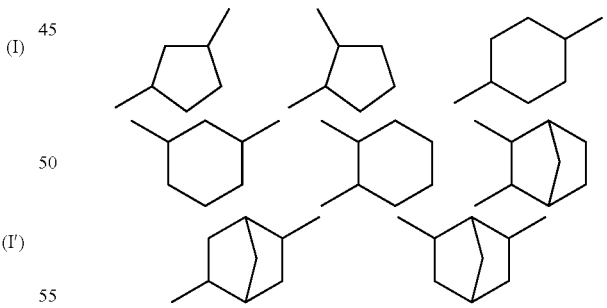

Examples of the divalent aromatic hydrocarbon group having from 2 to 39 carbon atoms, which has or does not have the bonding group, represented by Φ include groups represented by the following structural formulae.

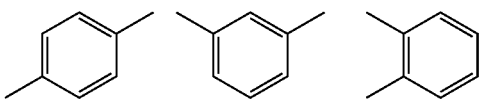

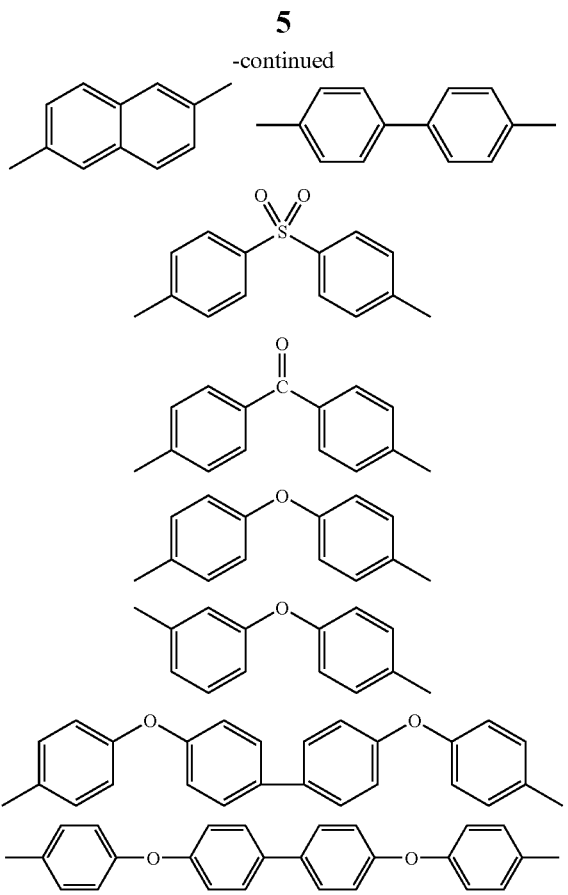

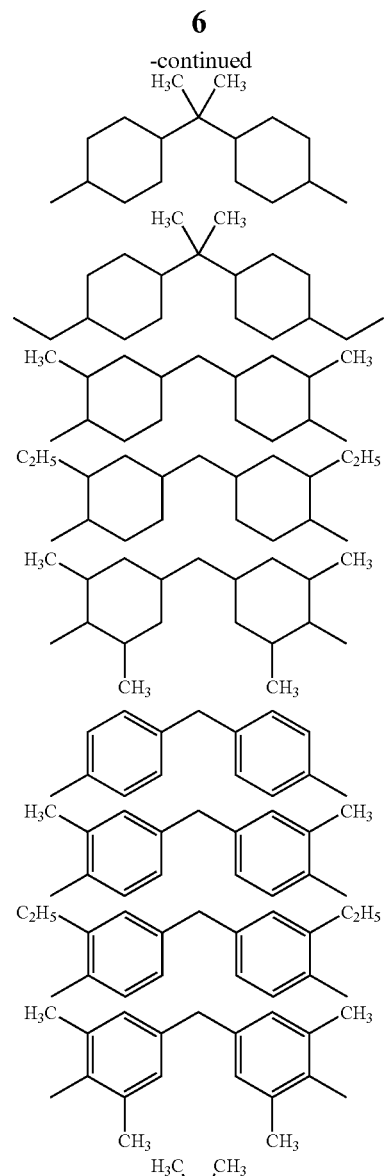

Examples of the group containing a combination of the aliphatic hydrocarbon group, the alicyclic hydrocarbon group and the aromatic hydrocarbon group include groups represented by the following structural formulae.

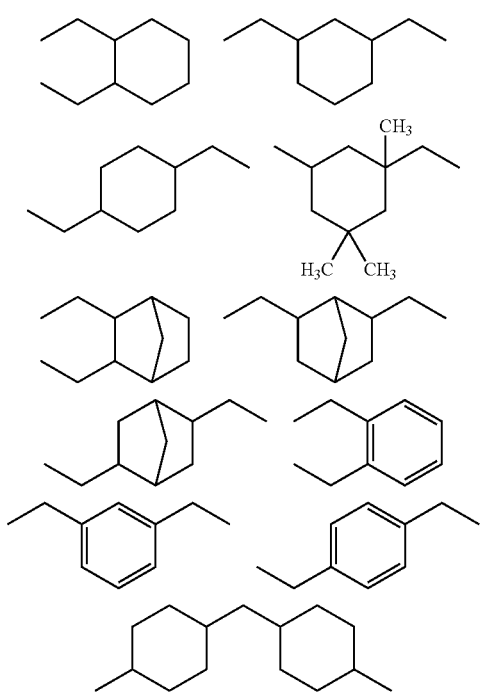

The group represented by Φ is preferably an aromatic hydrocarbon group having a bonding group and having from 2 to 39 carbon atoms or a combination of the aromatic hydrocarbon group and an aliphatic hydrocarbon group, and more preferably groups represented by the following structural formulae.

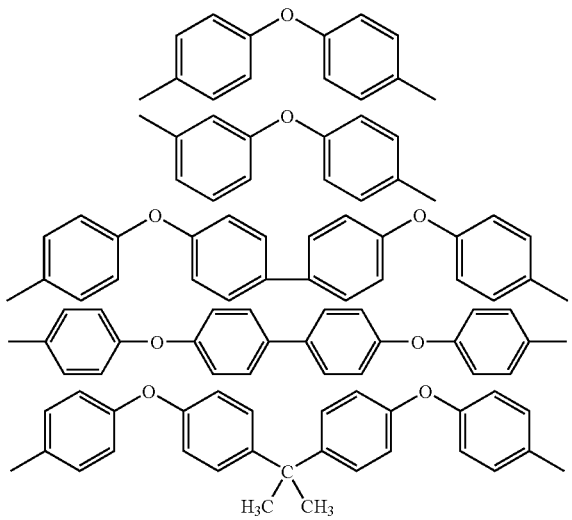

The polyamic acid (A') corresponds to the structure obtained by dissociating a part of imide bonds of the polyimide (A), as described above, and it can be considered that detailed description for the polyamic acid (A') corresponds to the polyimide (A). Accordingly, the polyimide (A) is described below as the representative.

The repeating unit represented by the general formula (I) is contained preferably in amount of from 10 to 100% by mol, more preferably from 50 to 100% by mol, further preferably from 80 to 100% by mol, and particularly preferably from 90 to 100% by mol, based on the total repeating units. The number of the repeating unit of the general formula (I) in one molecule of the polyimide (A) is from 10 to 2,000, and preferably from 20 to 200, and within the range, it is further preferred that the glass transition temperature is from 230 to 350° C., and more preferably from 250 to 330° C.

The polyimide (A) can be obtained by reacting an aliphatic or alicyclic tetracarboxylic acid or a derivative thereof with a diamine or a derivative thereof.

Examples of the derivative of an aliphatic or alicyclic tetracarboxylic acid include an aliphatic or alicyclic tetracarboxylic acid, an aliphatic or alicyclic tetracarboxylate ester and an aliphatic or alicyclic tetracarboxylic dianhydride. Among the aliphatic or alicyclic tetracarboxylic acid and the derivative thereof, an alicyclic tetracarboxylic dianhydride is preferred.

Examples of the derivative of a diamine include diisocyanate and diaminosilane. Among the diamine and the derivative thereof, a diamine is preferred.

Examples of the aliphatic tetracarboxylic acid include 1,2,3,4-butanetetracarboxylic acid. Examples of the alicyclic tetracarboxylic acid include 1,2,3,4-cyclobutanetetracarboxylic acid, 1,2,4,5-cyclopentanetetraracboxylic acid, 1,2,4,5-cyclohexanetetracarboxylic acid, bicyclo[2.2.2]oct-7-ene-2,3,5,6-tetracarboxylic acid and bicyclo[2.2.2]octane-2,3,5,6-tetracarboxylic acid.

Examples of the aliphatic tetracarboxylate ester include a monoalkyl ester, a dialkyl ester, a trialkyl ester and a tetraalkyl ester of the aforementioned aliphatic tetracarboxylic acids. Examples of the alicyclic tetracarboxylate ester include a monoalkyl ester, a dialkyl ester, a trialkyl ester and a tetraalkyl ester of the aforementioned alicyclic tetracarboxylic acids. The alkyl group moiety thereof is preferably an alkyl group having from 1 to 5 carbon atoms, and more preferably an alkyl group having from 1 to 3 carbon atoms.

Examples of the aliphatic tetracarboxylic dianhydride include 1,2,3,4-butanetetracarboxylic dianhydride. Examples of the alicyclic tetracarboxylic dianhydride include 1,2,3,4-cyclobutanetetracarboxylic dianhydride, 1,2,4,5-cyclopentanetetracarboxylic dianhydride, 1,2,4,5-cyclohexanetetracarboxylic dianhydride, bicyclo[2.2.2]oct-7-ene-2,3,5,6-tetracarboxylic dianhydride and bicyclo[2.2.2]octane-2,3,5,6-tetracarboxylic dianhydride. Among these, 1,2,4,5-cyclohexanetetracarboxylic dianhydride is particularly preferred. In general, with respect to a polyimide containing an aliphatic diamine as a constitutional component, a polyamic acid as an intermediate forms a firm salt with a diamine, and therefore, such a solvent is preferably used that has relatively high solubility for the salt (for example, cresol, N,N-dimethylacetamide, γ-butyrolactone and N-methyl-2-pyrrolidone) for providing a high molecular weight. However, in the case where 1,2,4,5-cyclohexanetetracarboxylic dianhydride is contained as a constitutional component in the polyimide containing an aliphatic diamine as a constitutional component, a polyamic acid and a diamine in the salt are bonded with a relatively weak bond, whereby a high molecular weight can be easily obtained to provide a flexible film.

The aliphatic or alicyclic tetracarboxylic acid or a derivative thereof may be used solely or in combination of two or more of them. Other tetracarboxylic acid or a derivative (particularly a dianhydride) thereof may be used in combination in such a range that the solubility of the polyimide in a solvent, and the flexibility, thermocompression bonding property and transparency of the film are not impaired.

Examples of the other tetracarboxylic acid or a derivative thereof include an aromatic tetracarboxylic acid, such as pyromellitic acid, 3,3',4,4'-biphenyltetracarboxylic acid, 2,3,3',4'-biphenyltetracarboxylic acid, 2,2-bis(3,4-dicarboxyphenyl)propane, 2,2-bis(2,3-dicarboxyphenyl)propane, 2,2-bis(3,4-dicarboxyphenyl)-1,1,1,3,3,3-hexafluoropropane, 2,2-bis(2,3-dicarboxyphenyl)-1,1,1,3,3,3-hexafluoropropane, bis(3,4-dicarboxyphenyl)sulfone, bis(3,4-dicarboxyphenyl)ether, bis(2,3-dicarboxyphenyl)ether, 3,3',4,4'-benzophenonetetracarboxylic acid, 2,2',3,3'-benzophenonetetracarboxylic acid, 4,4-(p-phenylenedioxy)diphthalic acid, 4,4-(m-phenylenedioxy)diphthalic acid, 1,1-bis(2,3-dicarboxyphenyl)ethane, bis(2,3-dicarboxyphenyl)methane and bis(3,4-dicarboxyphenyl)methane, and a derivative (particularly a dianhydride) thereof; and an aliphatic tetracarboxylic acid having from 1 to 3 carbon atoms, such as ethylenetetracarboxylic acid, and a derivative (particularly a dianhydride) thereof.

The diamine may be any of an aromatic diamine, an aliphatic diamine and a mixture thereof. The term "aromatic diamine" referred in the present invention shows a diamine having an amino group bonded directly to an aromatic ring, which may contain in the structure thereof an aliphatic hydrocarbon group, an alicyclic hydrocarbon group or other substituents (for example, a halogen atom, a sulfonyl group, a carbonyl group or an oxygen atom). The term "aliphatic diamine" shows a diamine having an amino group bonded directly to an aliphatic hydrocarbon group or an alicyclic hydrocarbon group, which may contain in the structure thereof an aromatic hydrocarbon group or other substituents (for example, a halogen atom, a sulfonyl group, a carbonyl group or an oxygen atom).

Examples of the aromatic diamine include p-phenylenediamine, m-phenylenediamine, 2,4-diaminotoluene, 2,6-diaminotoluene, benzidine, o-tolidine, m-tolidine, bis(trifluoromethyl)benzidine, octafluorobenzidine, 3,3'-dihydroxy-4,4'-diaminobiphenyl, 3,3'-dimethoxy-4,4'-diaminobiphenyl, 3,3'-dchloro-4,4'-diaminobiphenyl, 3,3'-difluoro-4,4'-diaminobiphenyl, 2,6-diaminonaphthalene, 1,5-diaminonaphthalene, 4,4'-diaminodiphenyl ether, 3,4'-diaminodiphenyl ether, 4,4'-diaminodiphenylmethane, 4,4'-diaminodiphenylsulfone, 3,4'-diaminodiphenylsulfone, 4,4'-diaminobenzophenone, 2,2-bis(4-(4-aminophenoxy)phenyl)propane, 2,2-bis(4-(2-methyl-4-aminophenoxy)phenyl)propane, 2,2-bis(4-(2,6-dimethyl-4-aminophenoxy)phenyl)propane, 2,2-bis(4-(4-aminophenoxy)phenyl)hexafluoropropane, 2,2-bis(4-(2-methyl-4-aminophenoxy)phenyl)hexafluoropropane, 2,2-bis(4-(2,6-dimethyl-4-aminophenoxy)phenyl)hexafluoropropane, 4,4'-bis(4-aminophenoxy)biphenyl, 4,4'-bis(2-methyl-4-aminophenoxy)biphenyl, 4,4'-bis(2,6-dimethyl-4-aminophenoxy)biphenyl, 4,4'-bis(3-aminophenoxy)biphenyl, bis(4-(4-aminophenoxy)phenyl)sulfone, bis(4-(2-methyl-4-aminophenoxy)phenyl)sulfone, bis(4-(2,6-dimethyl-4-aminophenoxy)phenyl)sulfone, bis(4-(4-aminopheoxy)phenyl)ether, bis(4-(2-methyl-4-aminophenoxy)phenyl)ether, bis(4-(2,6-dimethyl-4-aminophenoxy)phenyl)ether, 1,4-bis(4-aminophenoxy)benzene, 1,4-bis(2-methyl-4-aminophenoxy)benzene, 1,4-bis(2,6-dimethyl-4-aminophenoxy)benzene, 1,3-bis(4-aminophenoxy)benzene, 1,3-bis(2-methyl-4-aminophenoxy)benzene, 1,3-bis(2,6-dimethyl-4-aminophenoxy)benzene, 2,2-bis(4-aminophenyl)propane, 2,2-bis(2-methyl-4-aminophenyl)propane, 2,2-bis(3-methyl-4-aminophenyl)propane, 2,2-bis(3-ethyl-4-aminophenyl)propane, 2,2-bis(3,5-dimethyl-4-aminophenyl)propane, 2,2-bis(2,6-dimethyl-4-aminophenyl)propane, 2,2-bis(4-aminophenyl)hexafluoropropane, 2,2-bis(2-methyl-4-aminophenyl)hexafluoropropane, 2,2-bis(2,6-dimethyl-4-aminophenyl)hexafluoropropane, α,α'-bis(4-aminophenyl)-1,4-diisopropylbenzene, α,α'-bis(2-methyl-4-aminophenyl)-1,4-diisopropylbenzene, α,α'-bis(2,6-dimethyl-4-aminophenyl)-1,4-diisopropylbenzene, α,α'-bis(3-aminophenyl)-1,4-diisopropylbenzene, α,α'-bis(4-aminophenyl)-1,3-diisopropylbenzene, α,α'-bis(2-methyl-4-aminophenyl)-1,3-diisopropylbenzene, α,α'-bis(2,6-dimethyl-4-aminophenyl)-1,3-diisopropylbenzene, α,α'-bis(3-aminophenyl)-1,3-diisopropylbenzene, 9,9-bis(4-aminophenyl)fluorene, 9,9-bis(2-methyl-4-aminophenyl)fluorene, 9,9-bis(2,6-dimethyl-4-aminophenyl)fluorene, 1,1-bis(4-aminophenyl)cyclopentane, 1,1-bis(2-methyl-4-aminophenyl)cyclopentane, 1,1-bis(2,6-dimethyl-4-aminophenyl)cyclopentane, 1,1-bis(4-aminophenyl)cyclohexane, 1,1-bis(2-methyl-4-aminophenyl)cyclohexane, 1,1-bis(2,6-dimethyl-4-aminophenyl)cyclohexane, 1,1-bis(4-aminophenyl)-4-methylcyclohexane, 1,1-bis(4-aminophenyl)norbornane, 1,1-bis(2-methyl-4-aminophenyl)norbornane, 1,1-bis(2,6-dimethyl-4-aminophenyl)norbornane, 1,1-bis(4-aminophenyl)adamantane, 1,1-bis(2-methyl-4-aminophenyl)adamantane and 1,1-bis(2,6-dimethyl-4-aminophenyl)adamantane.

Examples of the aliphatic diamine include ethylenediamine, hexamethylenediamine, polyethylene glycol bis(3-aminopropyl)ether, polypropylene glycol bis(3-aminopropyl)ether, 1,3-bis(aminomethyl)cyclohexane, 1,4-bis(aminomethyl)cyclohexane, m-xylylenediamine, p-xylylenediamine, 1,4-bis(2-aminoisopropyl)benzene, 1,3-bis(2-aminoisopropyl)benzene, isophoronediamine, norbornanediamine, siloxanediamine, 4,4'-diaminodicyclohexylmethane, 3,3'-dimethyl-4,4'-diaminodicyclohexylmethane, 3,3'-diethyl-4,4'-diaminodicyclohexylmethane, 3,3',5,5'-tetramethyl-4,4'-diaminodicyclohexylmethane, 2,3-bis(aminomethyl)-bicyclo[2.2.1]heptane, 2,5-bis(aminomethyl)-bicyclo[2.2.1]heptane, 2,6-bis(aminomethyl)-bicyclo[2.2.1]heptane, 2,2-bis(4,4'-diaminocyclohexyl)propane and 2,2-bis(4,4'-diaminomethylcyclohexyl)propane.

Examples of a diisocyanate as the diamine derivative include a diisocyanate obtained by reacting the aforementioned aromatic or aliphatic diamine with phosgene.

Examples of a diaminodisilane compound as the diamine derivative include a trimethylsilylated aromatic or aliphatic diamine obtained by reacting the aforementioned aromatic or aliphatic diamine with chlorotrimethylsilane.

The diamine and a derivative thereof may be mixed arbitrarily, and the amount of the diamine therein is preferably from 50 to 100% by mol, and more preferably from 80 to 100% by mol.

In the step (1), an organic solvent solution of a polyamic acid or a polyimide is used. The organic solvent is capable of dissolving the polyamic acid or the polyimide, and usable examples thereof include N-methyl-2-pyrrolidone, N,N-dimethylacetamide, N,N-diethylacetamide, N,N-dimethylformamide, N,N-diethylformamide, N-methylcaprolactam, hexamethylphosphoramide, tetramethylenesulfone, dimethylsulfoxide, m-cresol, phenol, p-chlorophenol, 2-chloro-4-hydroxytoluene, diglyme, triglyme, tetraglyme, dioxane, γ-butyrolactone, dioxolane, cyclohexanone, cyclopentanone, 1,4-dioxane, ε-caprolactam, dichloromethane and chloroform, which may be used in combination of two or more of them. In consideration of the capability of the organic solvent solution of a polyimide (polyimide varnish) (e.g., long-term storage stability where the solubility of the polyimide is maintained to prevent insoluble matters from occurring), it is preferred to use N-methyl-2-pyrrolidone, N,N-dimethylacetamide or γ-butyrolactone solely or as a mixture of them.

In addition to these organic solvent, such a poor solvent as hexane, heptane, benzene, toluene, xylene, chlorobenzene and o-dichlorobenzene may be used in such an extent that the polyamic acid or the polyimide is not deposited.

Examples of a method for producing the organic solvent solution of a polyamic acid or a polyimide include the following methods (i) to (iii), but the method is not limited to them.

(i) An aliphatic or alicyclic tetracarboxylic acid or a derivative thereof is preferably added to an organic solvent solution of a diamine or a derivative thereof, or a diamine or a derivative thereof is preferably added to an organic solvent solution of the aliphatic or alicyclic tetracarboxylic acid component, and the solution is maintained preferably at a temperature of 80° C. or less (more preferably 30° C. or less) for from 0.5 to 3 hours to provide an organic solvent solution of a polyamic acid.

A solvent capable of forming azeotrope with water, such as toluene and xylene, is added to the resulting organic solvent solution of a polyamic acid, and dehydration reaction is performed while removing produced water outside the system by azeotropy to provide the organic solvent solution of the polyimide.

(ii) A dehydrating agent, such as acetic anhydride, is added to the organic solvent solution of a polyamic acid obtained in the same manner as in the item (i) to perform imidation, and a solvent having poor solubility to a polyimide, such as methanol, is added thereto to precipitate the polyimide. The polyimide is separated as a solid matter by filtration, washing and drying, and is then dissolved in the aforementioned organic solvent, such as N,N-dimethylacetamide, to provide the organic solvent solution of the polyimide.

(iii) The polyamic acid solution is prepared in the item (i) using an organic solvent having a boiling point of 150° C. or more, such as cresol, N,N-dimethylacetamide, γ-butyrolactone and N-methyl-2-pyrrolidone, to which a tertiary amine, such as triethylamine, is added, and the solution is maintained at from 150 to 220° C. for from 3 to 12 hours to perform imidation, thereby providing the organic solvent solution of the polyimide.

In the case where a polyamic acid or a polyimide is produced by solution polymerization, a tertiary amine is preferably used as a catalyst. Examples of the tertiary amine include a trialkylamine, such as trimethylamine, triethylamine, tripropylamine and tributylamine; an alcoholamine, such as triethanolamine, N,N-dimethylethanolamine and N,N-diethylethanolamine; a diamine, such as triethylenediamine; a nitrogen-containing alicyclic heterocyclic compound, such as N-methylpyrrolidone, N-ethylpyrrolidone, N-methylpiperidine and N-ethylpiperidine; and a nitrogen-containing aromatic heterocyclic compound, such as imidazole, pyridine, quinoline and isoquinoline. Among these tertiary amines, a trialkylamine is preferred, and triethylamine is more preferred.

The concentration of the polyamic acid or the polyimide in the organic solvent solution of the polyamic acid or the polyimide is preferably from 1 to 50% by mass, and more preferably from 10 to 40% by mass. In the case where the concentration is 50% by mass or less, the resulting polyimide film is improved in surface smoothness.

A surfactant, such as a fluorine series and a polysiloxane series, may be added to the organic solvent solution of the polyamic acid or the polyamide. The addition of the surfactant facilitates production of a film improved in surface smoothness. A commercially available product may be used as the surfactant, and examples of the fluorine surfactant include Megafac (a registered trademark) series, available from Dainippon Ink And Chemicals, Inc., and Ftergent (a registered trademark) 251, 212 MH, 250, 222F, 212D and FTX-218, which are Ftergent (a registered trademark) series, available from Neos Co., Ltd. Examples of the polysiloxane surfactant include BYK-307, BYK-315, BYK-320, BYK-325, BYK-330, BYK-331, BYK-332, BYK-333 and BYK-344, available from BYK Japan KK.

An antioxidant, such as a phenol series, a sulfur series, a phosphoric acid series and a phosphorous acid series, may be added to the organic solvent solution of the polyamic acid or the polyimide. Various kinds of functional materials may be added to or mixed with the organic solvent solution of the polyamic acid or the polyimide. Examples of the various kinds of functional materials include an electroconductive material, such as carbon nanotubes and a nano metallic material, a ferroelectric material, such as barium titanate, a fluorescent material, such as $ZnS:Ag$, $ZnS:Cu$ and $Y_2O_2S:Eu$, and an ultraviolet ray absorbent. A phosphorous flame retardant, such as ammonium polyphosphate, a phosphate ester, a condensed phosphate ester, a phenoxyphosphazene compound and a phosphate ester amide, may be added to the organic solvent solution of the polyamic acid or the polyimide, thereby imparting flame retardancy to the polyimide film. Among the phosphorus flame retardant, a phenoxyphosphazene compound is preferably used. Examples of the phenoxyphosphazene compound include SPS-100, available from Otsuka Chemical Co., Ltd. A phosphorus flame retardant is preferably used although flame retardancy can be imparted by mixing a halogen flame retardant.

The organic solvent solution of the polyamic acid or the polyimide may contain other components. Examples of the components include a colorant for providing white color, such as titanium dioxide, and an additive, such as a nanofiller. The use of titanium dioxide contained enhances the reflectivity to white light. The use of a nanofiller contained increases the apparent glass transition temperature of the resin composition molded article to enhance the heat resistance, and also increases the tensile elastic modulus to enhance the mechanical strength.

Preferred examples of the support, on which the organic solvent solution of the polyamic acid or the polyimide is flow-cast in the step (1), include a metallic plate, such as stainless steel and aluminum, and a glass plate, and a stainless steel plate and a stainless steel belt are particularly preferred.

Step (2)

In the production method of a colorless transparent resin film of the present invention, the organic solvent solution of the resin is flow-cast on the support in the step (1), and then a certain amount of the organic solvent is evaporated, for example, by passing the flow-cast material through a dryer of a type of blowing a gas having an oxygen content of from 0.001 to 15% by volume (preferably from 0.0055 to 10% by volume, more preferably from 1 to 10% by volume, and further preferably from 5 to 10% by volume) at a temperature of from 100 to 170° C., and the flow-cast material is released as a self-supporting film from the support.

The temperature of the gas in the dryer is preferably from 100 to 160° C., more preferably from 100 to 140° C., and further preferably from 110 to 140° C. In the case where the temperature of the gas is less than 100° C., the organic solvent is not sufficiently evaporated, whereby the film may be adhered to the support upon releasing from the support. In the case where the temperature of the gas exceeds 170° C., on the other hand, the solvent may be decomposed to color the film, and bubbles may be formed in the film due to quick evaporation of the solvent.

In the step (2), one dryer may be used, and plural dryers connected in series may be used. Plural areas with different flow velocities of the gas may be provided in one dryer. In this case, the gas to be used later preferably has a temperature that is higher than the temperature of the gas to be used immediately earlier, and the difference between the temperatures is preferably 10° C. or more.

In the case where the oxygen concentration of the gas used in the step (2) exceeds 15% by volume, the organic solvent may be decomposed with the gas with the aforementioned temperature range to color the film. There is a tendency that a higher temperature of the gas brings about conspicuous coloration due to oxidation reaction between oxygen and the organic solvent or between oxygen and the flow-cast material, and therefore, the oxygen concentration of the gas is necessarily within the aforementioned range with the aforementioned temperature range of the gas.

The major component of the gas used in the step (2) is preferably an inert gas, such as nitrogen and argon.

In the dryer, the gas is preferably blown in substantially parallel to the upper surface of the flow-cast material (within a range of from 0 to 10 degree, and preferably from 0 to 5 degree, with respect to the flow-cast material). The flow velocity of the gas is preferably from 1 to 36 m/sec, more preferably from 3 to 25 m/sec, and further preferably from 4 to 15 m/sec. Within the range, the period of time required for drying can be shortened, and simultaneously oxygen in the vicinity of the surface of the flow-cast material can be efficiently removed, whereby the possibility of coloration can be favorably decreased.

In the case where plural dryers are used and/or plural areas with different flow velocities of the gas is provided in the dryer, the plural gases may have different flow velocities, the gas to be used later preferably has a flow velocity that is larger than the flow velocity of the gas to be used immediately earlier, and the difference in flow velocity between them is preferably 0.5 m/sec or more. The flow velocity of the gas mentioned above is the velocity of the gas passing the surface of the flow-cast material (within a range of 5 cm from the flow-cast material).

The period of time of blowing the gas onto the surface of the flow-cast material is preferably from 10 minutes to 2 hours, more preferably from 10 minutes to 1 hour, and further preferably from 30 to 50 minutes, per once.

The gas used in the step (2) may be heated by using a known heat exchanger, such as a tubular exchanger of a shell and tube type. The heat source used may be, for example, an electric heating system, a heat medium heating system and a far-infrared ray heating system.

In the present invention, the solvent residual ratio of the film obtained by drying the flow-cast material by using the dryer with the aforementioned setting and releasing as a self-supporting film from the support is preferably 30% by mass or less, more preferably from 10 to 30% by mass, and further preferably from 15 to 25% by mass. The solvent residual ratio is preferably 10% by mass or more since the film does not become too hard to prevent cracking from occurring upon releasing the film, and the adhesion strength between the film and the support is prevented from becoming too large to avoid releasing failure. The solvent residual ratio is preferably 30% by mass or less since the film has appropriate strength and flexibility to prevent problems, such as elongation of the film, from occurring upon releasing the film from the support.

Step (3)

In the production method of the present invention, the self-supporting film obtained in the step (2) is dried in the step (3) containing the step (3-1) and the step (3-2) in this order. The film released from the support is further dried with a dryer to stabilize the properties of the resulting colorless transparent resin film.

Step (3-1)

In the step (3-1), the residual ratio of the organic solvent in the self-supporting film is lowered while blowing a gas having an oxygen content of 15% by volume or less (preferably 10% by volume or less, and more preferably 5% by volume or less) at a temperature of from 100 to 250° C. onto the film.

The temperature of the gas is preferably from 130 to 250° C., more preferably from 140 to 250° C., further preferably from 170 to 250° C., and particularly preferably from 170 to 210° C.

In the step (3-1), one dryer may be used, and plural dryers connected in series may be used. Plural areas with different flow velocities of the gas may be provided in one dryer. In this case, the gas to be used later preferably has a temperature that is higher than the temperature of the gas to be used immediately earlier, and the difference between the temperatures is preferably 10° C. or more, and more preferably 20° C. or more.

As the gas used in the step (3-1), a gas having a temperature that is higher than the temperature of the gas used lastly in the step (2) is preferably used at least once from the standpoint of the stability of the properties of the film. The difference in temperature between the gases is preferably 30° C. or more, more preferably 50° C. or more, and further preferably 60° C. or more.

The temperature of the gas that is firstly used in the step (3-1) is preferably higher than the temperature of the gas used lastly in the step (2) by from 1 to 100° C., more preferably from 1 to 70° C., and further preferably from 30° C. or less.

In the case where the oxygen concentration of the gas used in the step (3-1) exceeds 15% by volume, the organic solvent may be decomposed with the gas with the aforementioned temperature range to color the film. There is a tendency that a higher temperature of the gas brings about conspicuous coloration due to oxidation reaction between oxygen and the organic solvent or between oxygen and the film, and therefore, the oxygen concentration of the gas is necessarily within the aforementioned range with the aforementioned temperature range of the gas.

The major component of the gas used in the step (3-1) is preferably an inert gas, such as nitrogen and argon.

In the step (3-1), the gas may be blown onto both the upper surface and the lower surface of the film in substantially parallel to the surfaces of the film (within a range of from 0 to 10 degree, and preferably from 0 to 5 degree, with respect to the film), and the gas may be blown substantially perpendicularly to the film (within a range of from 80 to 100 degree, and preferably from 85 to 95 degree, with respect to the film). The flow velocity of the gas blown onto the upper surface of the film is preferably from 5 to 50 m/sec, more preferably from 10 to 45 m/sec, further preferably from 15 to 40 m/sec, and particularly preferably from 25 to 40 m/sec. The flow velocity of the gas blown onto the lower surface of the film is preferably from 0.3 to 1.1 times, more preferably from 0.5 to 1.1 times, and further preferably from 0.6 to 1 times, the flow velocity of the gas blown onto the upper surface from the standpoint of the stability of the film upon conveying.

When the flow velocity of the gas is in the range, the period of time required for drying can be shortened, and simultaneously oxygen in the vicinity of the surface of the flow-cast material can be efficiently removed, whereby the possibility of coloration can be favorably decreased, and the surface flatness of the film is enhanced.

In the case where plural dryers are used and/or plural areas with different flow velocities of the gas is provided in the dryer, the plural gases may have different flow velocities, the gas to be used later preferably has a flow velocity that is larger than the flow velocity of the gas to be used immediately earlier, and the difference in flow velocity between them is preferably 2 m/sec or more. The flow velocity of the gas mentioned above is the velocity of the gas passing the surface of the flow-cast material (within a range of 5 cm from the flow-cast material).

The period of time of blowing the gas onto the surface of the flow-cast material is preferably from 10 seconds to 1 hour, more preferably from 10 seconds to 30 minutes, and further preferably from 20 seconds to 15 minutes, per once.

The film obtained in the step (2) still has a large solvent residual ratio, and thus in the step (3-1), the film can be stretched, simultaneously with drying, by from 1.01 to 6 times in the machine direction and/or the transverse direction. In the case where the stretching ratio is less than 1.01 times, it is not preferred since the flatness of the film may be impaired. In the case where the stretching ratio exceeds 6 times, it is not preferred since the film may be broken.

The method of stretching may be uniaxial stretching in the machine direction, which is the conveying direction of the film, sequential biaxial stretching in the machine direction and the transverse direction, which is perpendicular to the machine direction, and simultaneous biaxial stretching in the machine direction and the transverse direction, and the sequential or simultaneous biaxial stretching is preferred. Any one of the sequential biaxial stretching and the simultaneous biaxial stretching may be employed, and the stretching method may be selected depending on the purpose, for example, anisotropy is imparted to the refractive index within the film plane, or an isotropic refractive index is provided for the film. The dryer is preferably a tenter dryer capable of retaining the position of the film stably in the dryer and capable of performing sequential or simultaneous biaxial stretching. The use of a tenter dryer prevents the volume of the film from being decreased randomly upon evaporating the solvent, whereby the film surface is prevented from being waved to improve the flatness of the film surface. In the purposes of the colorless transparent resin film of the present invention, such as a transparent substrate, a thin film transistor substrate and a flexible printed circuit substrate of a liquid crystal display device and an organic EL display device, and the like, it is not preferred that the flatness of the film is impaired since such problems may occur that an image is disturbed, and desired wiring cannot be produced.

The step (3-1) may contain a step of relaxing the film that has been once stretched. The film may be relaxed, whereby the stress occurring in the film by stretching can be relaxed. In the case where the film is sent to the subsequent step while the stress remains in the film, it is not preferred since the film may be shrunk by stress relaxation to cause wrinkle in the film.

Step (3-2)

In the step (3-2), the residual ratio of the organic solvent in the self-supporting film and the stress remaining in the film are considerably lowered while blowing a gas having an oxygen content of 5% by volume or less (preferably 2% by volume or less, more preferably 1% by volume or less, and further preferably 0.5% by volume or less) at a temperature of from 150 to 450° C. onto the film.

The temperature of the gas is preferably from 170 to 300° C., more preferably from 170 to 290° C., further preferably from 200 to 280° C., and particularly preferably from 210 to 280° C. In the step (3-2), it is preferred to use a gas at 240° C. or more (preferably 250° C. or more, further preferably 260° C. or more, and particularly preferably 180° C. or more) at least one for considerably decreasing the solvent residual ratio to provide favorable properties of the resulting film.

In the step (3-2), one dryer may be used, and plural dryers connected in series may be used. Plural areas with different flow velocities of the gas may be provided in one dryer. In this case, the gas to be used later preferably has a temperature that is higher than the temperature of the gas to be used immediately earlier, and the difference between the temperatures is preferably 5° C. or more, more preferably 10° C. or more, and further preferably 20° C. or more.

As the gas used in the step (3-2), a gas having a temperature that is higher than the temperature of the gas used lastly in the step (3-1) is preferably used at least once from the standpoint of the stability of the properties of the film. The difference in temperature between the gases is preferably 1° C. or more, more preferably 20° C. or more, further preferably 30° C. or more, and particularly preferably 60° C. or more.

The temperature of the gas that is firstly used in the step (3-2) is preferably higher than the temperature of the gas used lastly in the step (3-1) by from 1 to 100° C., more preferably from 1 to 50° C., and further preferably from 30° C. or less.

In the case where the oxygen concentration of the gas used in the step (3-2) exceeds 5% by volume, the organic solvent may be decomposed with the gas with the aforementioned temperature range to color the film, and the film itself may be oxidized to cause coloration. The temperature of the gas may be 240° C. or more in the step (3-2), and in this case, there is a tendency that coloration due to oxidation reaction between oxygen and the organic solvent or between oxygen and the film may occur conspicuously. Accordingly, the oxygen concentration of the gas is necessarily within the aforementioned range with the aforementioned temperature range of the gas.

The major component of the gas used in the step (3-2) is preferably an inert gas, such as nitrogen and argon.

In the step (3-2), the gas may be blown onto both the upper surface and the lower surface of the film in substantially parallel to the surfaces of the film (within a range of from 0 to 10 degree, and preferably from 0 to 5 degree, with respect to the film), and the gas may be blown substantially perpendicularly to the film (within a range of from 80 to 100 degree, and preferably from 85 to 95 degree, with respect to the film). The flow velocity of the gas blown onto the upper and lower surfaces of the film is preferably from 1 to 20 m/sec, more preferably from 1 to 10 m/sec, further preferably from 2 to 5 m/sec, and particularly preferably from 3 to 5 m/sec.

When the flow velocity of the gas is in the range, it is preferred since possibility of coloration can be decreased, the solvent residual ratio and the residual stress can be considerably decreased, and the surface flatness of the film can be enhanced.

In the case where plural dryers are used and/or plural areas with different flow velocities of the gas is provided in the dryer, the plural gases may have different flow velocities. The flow velocity of the gas mentioned above is the velocity of the gas passing the surface of the flow-cast material (within a range of 5 cm from the flow-cast material).

The period of time of blowing the gas onto the surface of the film is preferably from 30 seconds to 1 hour, more preferably from 1 to 45 minute, and further preferably from 2 to 15 minutes, per once.

The gas used in the step (3-2) may be heated by using a known heat exchanger, such as a tubular exchanger of a shell and tube type. The heat source used may be, for example, an electric heating system, a heat medium heating system and a far-infrared ray heating system, and a far-infrared ray heating system is preferably used. In particular, such a dryer of a far-infrared ray heating system is preferably used that is capable of heating the film directly by far-infrared ray heating, and the film is dried while blowing a gas heated with a far-infrared heater onto the film. In the case where the film is directly heated and dried with a dryer of a far-infrared heating type, the drying temperature is preferably the same as the temperature of the gas.

The colorless transparent resin film thus obtained has a solvent residual ratio of 3% by mass or less (1.5% by mass or less for a high quality product, from 0.1 to 1.2% by mass for a higher quality product, from 0.1 to 1% by mass of a further higher quality product, and from 0.1 to 0.5% by mass for a particularly higher quality product). In the case where the solvent residual ratio of the film is 3% by mass or less, upon forming a functional inorganic film or a functional organic film, such as a transparent electroconductive film and an antireflection film, on the colorless transparent resin film by a vacuum deposition process, a desired vacuum degree can be obtained. If the vacuum degree cannot be sufficiently increased, a functional inorganic film or a functional organic film may not be formed in a prescribed amount, which is not preferred from the practical and economical point of view.

The resin film has a total light transmittance of 88% or more (89% or more for a high quality product, and further 90% or more), an YI (yellow index) of 3 or less (2.5 or less for a high quality product, further 2.0 or less, and still further 1.9 or less) and a haze of 1.5 or less (1.1 or less for a high quality product, further 0.8 or less, and still further 0.5 or less), and thus has considerably excellent transparency.

EXAMPLE

The present invention will be specifically described with reference to examples below. The present invention is not limited to the examples.

The polyimide films obtained in Examples and Comparative Examples were evaluated in the following manners.

(1) Glass Transition Temperature

The glass transition temperature was obtained by performing DSC measurement with a differential scanning calorimeter (DSC-50, produced by Shimadzu Corporation) under conditions of a temperature increasing rate of 10° C. per minute.

(2) Linear Expansion Coefficient

Measurement was performed with a thermomechanical analyzer (TMA100, produced by Seiko Instruments, Inc.) under application of a load of 50 mN under conditions of a temperature increasing rate of 10° C. per minute, and an average value in a range of from 100 to 150° C. was obtained.

(3) Total Light Transmittance, YI (yellow index) and Haze

The total light transmittance, the YI and the haze were measured with a haze meter (Z-Σ80, produced by Nippon Denshoku Industries Co., Ltd.) according to JIS K7105.

(4) Solvent Residual Ratio

A specimen was heated from room temperature to 300° C. at a temperature increasing rate of 15° C. per minute and maintained at 300° C. for 30 minutes under a nitrogen stream with a thermogravimetric analyzer (DTG-50, produced by Shimizdu Corporation). The total mass that was decreased in the period where the temperature was increased from 150° C. to 300° C. and the period where the temperature was maintained at 300° C. for 30 minutes was divided by the initial mass of the specimen to provide a value, which was designated as the solvent residual ratio.

Reference Example 1

Synthesis of 1,2,4,5-cyclohexanetetracarboxylic dianhydride 22.08 kg (86.88 mol) of pyromellitic acid, 8 kg of a catalyst containing rhodium supported on activated carbon (produced by N.E. Chemcat Corporation) and 80 kg of water were charged in a reactor made of Hastelloy (HC22) having a capacity of 200 L, and the interior of the reactor was replaced by nitrogen gas under stirring. The interior of the reactor was then replaced by hydrogen gas, and the temperature was increased to 50° C. under a hydrogen pressure in the reactor of 3.3 MPa. The reaction was performed for 2 hours while maintaining the hydrogen pressure to 3.3 MPa. The hydrogen gas in the reactor was replaced by nitrogen gas, the reaction liquid was taken out from the autoclave, and the reaction liquid was filtered in a hot state to separate the catalyst. The filtrate was concentrated by evaporating water under reduced pressure with a rotary evaporator to deposit crystals. The crystals thus deposited were separated by solid-liquid separation at room temperature and dried to provide 19.24 kg (73.94 mol, yield: 85.1%) of 1,2,4,5-cyclohexanetetracarboxylic acid.

Subsequently, 18 kg (69.18 mol) of 1,2,4,5-cyclohexanetetracarboxylic acid thus obtained, 21.19 kg (207.53 mol) of acetic anhydride and 50.81 kg of acetic acid were charged in a reactor made of Hastelloy (HC22) having a capacity of 200 L, and the interior of the reactor was replaced by nitrogen gas under stirring. The temperature was increased to the reflux temperature of the solvent under a nitrogen gas atmosphere, and the solvent was refluxed for 10 minutes. The reaction liquid was cooled to room temperature under stirring to deposit crystals. The crystals thus deposited were separated by solid-liquid separation and dried to provide primary crystals. The separated mother liquid was concentrated under reduced pressure with a rotary evaporator to deposit crystals. The crystals were separated by solid-liquid separation and dried to provide secondary crystals. The primary crystals and the secondary crystals were combined to provide 15 kg (66.91 mol, yield of dehydration: 96.7%) of 1,2,4,5-cyclohexanetetracarboxylic dianhydride.

Reference Example 2

4.34 kg (12.6 mol) of α,α"-bis(4-amino-phenyl)-1,4-diisopropylbenzene, 1.99 kg (5.4 mol) of 4,4'-bis(4-aminophenoxy)biphenyl and as a solvent 12.5 kg of γ-butyrolactone and 3.13 kg of N,N-dimethylacetamide were charged in a reactor made of SUS316L having a capacity of 60 L equipped with a thermometer, a stirrer, a nitrogen introducing tube and a condenser, and were dissolved with each other, thereby increasing the temperature to approximately 70° C. Subsequently, 4.04 kg (18 mol) of 1,2,4,5-cyclohexanetetracarboxylic dianhydride synthesized in Reference Example 1 was added thereto by dividing into plural portions over 1 hour, and after adding 91 g (0.9 mol) of triethylamine as an imidation catalyst thereto, the temperature was increased to 180° C. to perform reaction for 3 hours while distilling off and recovering produced water.

After lapsing 3 hours, it was confirmed that the recovered water was 1.095 kg and distillation of water was completed, and then 27.16 kg of N,N-dimethylacetamide was added. The temperature of the contents was cooled to 60° C., and 53.2 kg of an organic solvent solution of a polyimide was taken out.

The resulting organic solvent solution of a polyimide was coated on a glass plate, and after evaporating the solvent by heating on a hot plate at 90° C. for 1 hour, the resulting film was released from the glass plate to provide a self-supporting film (i.e., a film capable of being handled by itself). The self-supporting film was fixed to a stainless steel fixing jig and heated in a vacuum dryer at 200° C. for 5 hours to evaporate further the solvent, thereby providing a flexible film having a thickness of 100 μm. The measurement of IR spectrum of the film revealed that the characteristic absorption of an imide ring was observed at ν (C=O)=1,772, 1,700 (cm$^{-1}$). The polyimide had a glass transition temperature of 303° C.

Example 1

Step (1): The organic solvent solution of the polyimide obtained in Reference Example 2 was extruded from a T-die with a metering pump in a prescribed amount and flow-cast on a rotating stainless steel belt.

Step (2): Subsequently, the flow-cast material was dried for 50 minutes while blowing a mixed gas containing 10% by volume of oxygen and 90% by volume of nitrogen heated to 120° C. onto the flow-cast material at a flow velocity of 6.6 m/sec, and further dried for 50 minutes while blowing a mixed gas containing 10% by volume of oxygen and 90% by volume of nitrogen heated to 140° C. at a flow velocity of 6.9 m/sec, followed by being released from the stainless steel belt, to provide a self-supporting film having a thickness of 220 μm. The self-supporting film had a total light transmittance of 89.8%, a YI (yellow index) of 1.74, a haze of 1.10% and a solvent residual ratio of 21.0% by mass.

Step (3-1): The self-supporting film obtained in the step (2) was passed through a tenter dryer, and while blowing a mixed gas containing 10% by volume of oxygen and 90% by volume of nitrogen at 170° C. onto the upper surface of the film at a flow velocity of 32 m/sec and onto the lower surface of the film at a flow velocity of 21 m/sec for 3 minutes and 30 seconds, at 200° C. onto the upper surface of the film at a flow velocity of 34 m/sec and onto the lower surface of the film at a flow velocity of 22 m/sec for 8 minutes, and further at 250°

C. onto the upper surface of the film at a flow velocity of 38 m/sec and onto the lower surface of the film at a flow velocity of 25 m/sec for 11 minutes, the film was biaxially stretched simultaneously in the machine direction by 1.01 times and in the transverse direction by 1.03 times during the passage of the film through the dryer. The resulting polyimide film had a thickness of 205 μm, a total light transmittance of 89.8%, a YI of 1.80 and a haze of 1.17%, which showed good transparency. The solvent residual ratio thereof was 5.1% by mass.

Step (3-2): The film obtained in the step (3-1) was dried by blowing nitrogen containing 1,000 ppm oxygen at a flow rate of 3.3 m/sec at 280° C. for 45 minutes by using a dryer of a far-infrared heating type that dried the film by directly heating the film by far-infrared heating and simultaneously blew nitrogen containing 1,000 ppm oxygen heated by a far-infrared heater. The resulting polyimide film had a thickness of 200 μm, a total light transmittance of 89.8%, a YI of 1.9 and a haze of 0.74%, which showed good transparency, and the solvent residual ratio thereof was 0.5% by mass.

Example 2

A polyimide film was obtained in the same manner as in Example 1 except that the gas blown onto the flow-cast material in the step (2) in Example 1 was changed to a gas having an oxygen concentration of 15% by volume and containing 85% by volume of nitrogen.

The polyimide film obtained in the step (3-1) had a thickness of 205 μm, a total light transmittance of 89.6%, a YI of 2.0 and a haze of 1.22%, which showed good transparency, and the solvent residual ratio thereof was 5.1% by mass.

The polyimide film obtained in the step (3-2) had a thickness of 200 μm, a total light transmittance of 89.6%, a YI of 2.0 and a haze of 0.77%, which showed good transparency, and the solvent residual ratio thereof was 0.5% by mass.

Example 3

A polyimide film was obtained in the same manner as in Example 1 except that in the step (2) in Example 1, the flow velocity of the gas at 120° C. blown onto the flow-cast material was changed to 13.2 m/sec, and the flow velocity of the gas at 140° C. blown thereto was changed to 13.8 m/sec.

The polyimide film obtained in the step (3-1) had a thickness of 205 μm, a total light transmittance of 90.0%, a YI of 2.1 and a haze of 0.70%, which showed good transparency, and the solvent residual ratio thereof was 4.9% by mass.

The polyimide film obtained in the step (3-2) had a thickness of 200 μm, a total light transmittance of 90.0%, a YI of 2.1 and a haze of 0.30%, which showed good transparency, and the solvent residual ratio thereof was 0.5% by mass.

Example 4

A polyimide film was obtained in the same manner as in Example 1 except that the gas in the step (3-1) in Example 1 was changed to a gas having an oxygen concentration of 15% by volume and a nitrogen concentration of 85% by volume.

The polyimide film obtained in the step (3-1) had a thickness of 205 μm, a total light transmittance of 89.6%, a YI of 2.7 and a haze of 1.30%, which showed good transparency, and the solvent residual ratio thereof was 5.1% by mass.

The polyimide film obtained in the step (3-2) had a thickness of 200 μm, a total light transmittance of 89.5%, a YI of 2.88 and a haze of 0.89%, which showed good transparency, and the solvent residual ratio thereof was 1.0% by mass.

Example 5

A polyimide film was obtained in the same manner as in Example 1 except that the gas in the step (3-2) in Example 1 was changed to a gas having an oxygen concentration of 2% by volume and a nitrogen concentration of 98% by volume.

The polyimide film obtained in the step (3-2) had a thickness of 200 μm, a total light transmittance of 88.0%, a YI of 2.5 and a haze of 0.74%, which showed good transparency, and the solvent residual ratio thereof was 0.5% by mass.

Example 6

A polyimide film was obtained in the same manner as in Example 1 except that in the step (3-1) in Example 1, the self-supporting film was biaxially stretched simultaneously in the machine direction by 2.0 times and in the transverse direction by 2.0 times during the passage of the film through the tenter dryer.

The polyimide film obtained in the step (3-1) had a thickness of 60 μm, a total light transmittance of 90.1%, a YI of 1.2 and a haze of 0.55%, which showed good transparency, and the solvent residual ratio thereof was 9.6% by mass.

The polyimide film obtained in the step (3-2) had a thickness of 50 μm, a total light transmittance of 90.1%, a YI of 1.3 and a haze of 0.50%, which showed good transparency, and the solvent residual ratio thereof was 0.6% by mass.

Example 7

A polyimide film was obtained in the same manner as in Example 1 except that in the step (3-1) in Example 1, the self-supporting film was biaxially stretched simultaneously in the machine direction by 1.01 times and in the transverse direction by 1.73 times during the passage of the film through the tenter dryer.

The polyimide film obtained in the step (3-1) had a thickness of 120 μm, a total light transmittance of 90.2%, a YI of 1.5 and a haze of 0.66%, which showed good transparency, and the solvent residual ratio thereof was 4.8% by mass.

The polyimide film obtained in the step (3-2) had a thickness of 115 μm, a total light transmittance of 90.0%, a YI of 1.5 and a haze of 0.47%, which showed good transparency, and the solvent residual ratio thereof was 0.5% by mass.

Example 8

A polyimide film was obtained in the same manner as in Example 1 except that in the step (3-2) in Example 1, the drying temperature and the period of time for blowing the gas were changed to 255° C. for 10 minutes, 280° C. for 10 minutes and 290° C. for 10 minutes.

The polyimide film obtained in the step (3-2) had a thickness of 200 μm, a total light transmittance of 89.6%, a YI of 1.7 and a haze of 0.49%, which showed good transparency, and the solvent residual ratio thereof was 1.0% by mass.

Comparative Example 1

A polyimide film was obtained in the same manner as in Example 1 except that the gas in the step (3-1) in Example 1 was changed to the air having an oxygen concentration of 21% by volume.

The polyimide film obtained in the step (3-1) had a thickness of 205 μm, a total light transmittance of 80.3%, a YI of 4.0 and a haze of 2.5%, which showed lowered transparency, and the solvent residual ratio thereof was 4.9% by mass.

The polyimide film obtained in the step (3-2) had a thickness of 200 μm, a total light transmittance of 80.0%, a YI of 5.0 and a haze of 3.0%, which showed deterioration in transparency and coloration of the film. The solvent residual ratio thereof was 0.8% by mass.

Comparative Example 2

A polyimide film was obtained in the same manner as in Example 1 except that the gas in the step (3-2) in Example 1 was changed to the air having an oxygen concentration of 21% by volume.

The polyimide film obtained in the step (3-2) had a thickness of 200 μm, a total light transmittance of 70%, a YI of 77.0 and a haze of 1.5%, which showed deterioration in transparency and coloration of the film. The solvent residual ratio thereof was 0.7% by mass.

Comparative Example 3

A polyimide film was obtained in the same manner as in Example 1 except that in the step (3-2) in Example 1, the drying temperature and the period of time for blowing the gas were changed to 455° C. for 25 minutes.

The polyimide film obtained in the step (3-2) had a thickness of 200 μm, a total light transmittance of 69.3%, a YI of 93.2 and a haze of 4.5%, which showed deterioration in transparency and coloration of the film. The solvent residual ratio thereof was 0.3% by mass.

Comparative Example 4

A polyimide film was obtained in the same manner as in Example 1 except that in Example 1, the film was not subjected to the step (3-1) and, in the step (3-2), the film was dried at 280° C. while blowing nitrogen having an oxygen concentration of 1,000 ppm thereto at a flow velocity of 3.2 m/sec.

However, the film was elongated in the dryer of a far-infrared heating type and suffered stripes in the machine direction to cause appearance failure.

Comparative Example 5

A polyimide film was obtained in the same manner as in Example 1 except that in Example 1, the film was not subjected to the step (3-2).

One piece of a film having a dimension of 150 mm×150 mm was cut out from the resulting film, and placed in a vacuum chamber, which was evacuated with a vacuum pump for measuring the vacuum degree attained, but 1 torr (133 Pa) was not attained after 30 minutes. It was found that the remaining solvent was gradually evaporated to prevent the vacuum degree from being increased, thereby failing vacuum deposition.

Example 9

Step (1): The organic solvent solution of the polyimide obtained in Reference Example 2 was extruded from a T-die with a metering pump in a prescribed amount and flow-cast on a rotating stainless steel belt.

Step (2): Subsequently, the flow-cast material was dried for 15 minutes while blowing a mixed gas containing 10% by volume of oxygen and 90% by volume of nitrogen heated to 110° C. onto the flow-cast material at a flow velocity of 6.4 m/sec, and further dried for 15 minutes while blowing a mixed gas containing 10% by volume of oxygen and 90% by volume of nitrogen heated to 160° C. at a flow velocity of 7.2 m/sec, followed by being released from the stainless steel belt, to provide a self-supporting film having a thickness of 120 μm. The self-supporting film had a total light transmittance of 91.5%, a YI of 2.16, a haze of 0.99% and a solvent residual ratio of 23.6% by mass.

Step (3-1): The self-supporting film obtained in the step (2) was passed through a tenter dryer, and while blowing a mixed gas containing 10% by volume of oxygen and 90% by volume of nitrogen at 150° C. onto the upper surface of the film at a flow velocity of 30 m/sec and onto the lower surface of the film at a flow velocity of 20 m/sec for 30 seconds, at 190° C. onto the upper surface of the film at a flow velocity of 33 m/sec and onto the lower surface of the film at a flow velocity of 22 m/sec for 35 seconds, and further at 250° C. onto the upper surface of the film at a flow velocity of 38 m/sec and onto the lower surface of the film at a flow velocity of 25 m/sec for 25 seconds, the film was biaxially stretched simultaneously in the machine direction by 2.0 times and in the transverse direction by 2.0 times during the passage of the film through the dryer. The resulting polyimide film had a thickness of 28 μm, a total light transmittance of 90.1%, a YI of 1.2 and a haze of 0.5%, which showed good transparency. The solvent residual ratio thereof was 6.5% by mass.

Step (3-2): The film obtained in the step (3-1) was dried by blowing nitrogen containing 1,000 ppm oxygen at a flow rate of 3.3 m/sec at 280° C. for 25 minutes by using a dryer that dried the film by directly heating the film by far-infrared heating and simultaneously blew heated nitrogen containing 1,000 ppm oxygen. The polyimide film finally obtained had a thickness of 25 μm, a total light transmittance of 90.1%, a YI of 1.7 and a haze of 0.5%, which showed good transparency, and the solvent residual ratio thereof was 1.2% by mass.

Reference Example 3

7.39 g (18.0 mol) of 2,2-bis(4-(4-aminophenoxy)phenyl)-propane (BAPP) and as a solvent 12.5 kg of γ-butyrolactone and 3.13 kg of N,N-dimethylacetamide were charged in a reactor made of SUS316L having a capacity of 60 L equipped with a thermometer, a stirrer, a nitrogen introducing tube and a condenser, and were dissolved with each other, thereby increasing the temperature to approximately 70° C. Subsequently, 4.04 kg (18.0 mol) of 1,2,4,5-cyclohexanetetracarboxylic dianhydride synthesized in the same manner as in Reference Example 1 was added thereto by dividing into plural portions over 1 hour, and after adding 91 g (0.9 mol) of triethylamine as an imidation catalyst thereto, the temperature was increased to 180° C. to perform reaction for 6 hours while distilling off and recovering produced water.

After lapsing 3 hours, it was confirmed that the recovered water was 1.205 kg and distillation of water was completed, and then 27.96 kg of N,N-dimethylacetamide was added. The temperature of the contents was cooled to 60° C., and 53.9 kg of an organic solvent solution of a polyimide was taken out.

The resulting organic solvent solution of a polyimide was coated on a glass plate, and after evaporating the solvent by heating on a hot plate at 90° C. for 1 hour, the resulting film was released from the glass plate to provide a self-supporting film. The self-supporting film was fixed to a stainless steel fixing jig and heated in a vacuum dryer at 200° C. for 5 hours to evaporate further the solvent, thereby providing a flexible film having a thickness of 100 μm. The measurement of IR spectrum of the film revealed that the characteristic absorption of an imide ring was observed at ν (C=O)=1,772, 1,700 (cm$^{-1}$). The polyimide had a glass transition temperature of 260° C.

Example 10

Step (1): The organic solvent solution of the polyimide obtained in Reference Example 3 was extruded from a T-die with a metering pump in a prescribed amount and flow-cast on a rotating stainless steel belt.

Step (2): Subsequently, the flow-cast material was dried for 30 minutes while blowing a mixed gas containing 15% by volume of oxygen and 85% by volume of nitrogen heated to 110° C. onto the flow-cast material at a flow velocity of 4.3 m/sec, and further dried for 30 minutes while blowing a mixed gas containing 15% by volume of oxygen and 85% by volume of nitrogen heated to 130° C. at a flow velocity of 7.4 m/sec, followed by being released from the stainless steel belt, to provide a self-supporting film having a width of 630 mm and a thickness of 126 μm. The self-supporting film had a total light transmittance of 89.8%, a YI of 2.80, a haze of 1.10% and a solvent residual ratio of 18.0% by mass.

Step (3-1): The self-supporting film obtained in the step (2) was passed horizontally through a tenter dryer, and while blowing a mixed gas containing 15% by volume of oxygen and 85% by volume of nitrogen at 140° C. onto the upper surface of the film at a flow velocity of 15 m/sec and onto the lower surface of the film at a flow velocity of 9.9 m/sec for 3 minutes and 18 seconds, at 200° C. onto the upper surface of the film at a flow velocity of 15 m/sec and onto the lower surface of the film at a flow velocity of 9.9 m/sec for 9 minutes and 24 seconds, and further at 170° C. onto the upper surface of the film at a flow velocity of 15 m/sec and onto the lower surface of the film at a flow velocity of 9.9 m/sec for 1 minute and 20 seconds, the film was biaxially stretched simultaneously in the machine direction by 1.01 times and in the transverse direction by 1.06 times during the passage of the film through the dryer. The resulting polyimide film had a thickness of 110 μm, a total light transmittance of 89.8%, a YI of 2.97 and a haze of 1.17%, which showed good transparency. The solvent residual ratio thereof was 7.1% by mass.

Step (3-2): The film obtained in the step (3-1) was cut in 40 mm on both edges thereof with a trimming device, and dried by blowing nitrogen containing 1,000 ppm oxygen onto both the upper and lower surfaces of the film at a flow rate of 3.2 m/sec at 195° C. for 4.3 minutes, at a flow rate of 4.2 m/sec at 205° C. for 6.4 minutes, at a flow rate of 3.6 m/sec at 220° C. for 7.5 minutes, at a flow rate of 4.2 m/sec at 220° C. for 6.4 minutes, at a flow rate of 3.5 m/sec at 220° C. for 3.2 minutes, at a flow rate of 3.6 m/sec at 230° C. for 7.5 minutes, at a flow rate of 4.2 m/sec at 240° C. for 6.4 minutes, and at a flow rate of 3.5 m/sec at 220° C. for 3.2 minutes, by using a dryer that dried the film by directly heating the film by far-infrared heating and simultaneously blew nitrogen containing 1,000 ppm oxygen heated by a far-infrared heater.

The polyimide film obtained in the step (3-2) had a thickness of 103 μm, a width of 550 mm, a total light transmittance of 89.8%, a YI of 3.12 and a haze of 1.17%, which showed good transparency, and was good in flatness. The solvent residual ratio thereof was 0.9% by mass.

One piece of a film having a dimension of 150 mm×150 mm was cut out from the resulting film, and placed in a vacuum chamber, which was evacuated with a vacuum pump for measuring the vacuum degree attained, and the vacuum degree reached 10$^{-5}$ torr (133×10$^{-5}$ Pa) in 30 minutes. Accordingly, it was found that the film was able to be vacuum deposited.

Comparative Example 6

A polyimide film was obtained in the same manner as in Example 10 except that in Example 10, the film was not subjected to the step (3-1).

However, in the step (3-2), the film was elongated in the dryer of a far-infrared heating type and suffered stripes in the machine direction to cause appearance failure.

Comparative Example 7

A polyimide film was obtained in the same manner as in Example 10 except that in Example 10, the film was not subjected to the step (3-2).

One piece of a film having a dimension of 150 mm×150 mm was cut out from the resulting film, and placed in a vacuum chamber, which was evacuated with a vacuum pump for measuring the vacuum degree attained, but 1 torr (133 Pa) was not attained after 30 minutes. It was found that the remaining solvent was gradually evaporated to prevent the vacuum degree from being increased, thereby failing vacuum deposition.

Example 11

Step (1): The organic solvent solution of the polyimide obtained in Reference Example 2 was extruded from a T-die with a metering pump in a prescribed amount and flow-cast on a rotating stainless steel belt.

Step (2): Subsequently, the flow-cast material was dried for 30 minutes while blowing a mixed gas containing 15% by volume of oxygen and 85% by volume of nitrogen heated to 120° C. onto the flow-cast material at a flow velocity of 6.6 m/sec, and further dried for 30 minutes while blowing a mixed gas containing 15% by volume of oxygen and 85% by volume of nitrogen heated to 130° C. at a flow velocity of 7.4 m/sec, followed by being released from the stainless steel belt, to provide a self-supporting film having a thickness of 130 μm and a width of 630 mm. The self-supporting film had a total light transmittance of 90.2%, a YI (yellow index) of 1.74, a haze of 1.10% and a solvent residual ratio of 20.0% by mass.

Step (3-1): The self-supporting film obtained in the step (2) was passed horizontally through a tenter dryer, and while blowing a mixed gas containing 8% by volume of oxygen and 92% by volume of nitrogen at 160° C. onto the upper surface of the film at a flow velocity of 15 m/sec and onto the lower surface of the film at a flow velocity of 9.9 m/sec for 30 seconds, at 170° C. onto the upper surface of the film at a flow velocity of 15 m/sec and onto the lower surface of the film at a flow velocity of 9.9 m/sec for 1 minute and 10 seconds, and further at 200° C. onto the upper surface of the film at a flow velocity of 15 m/sec and onto the lower surface of the film at a flow velocity of 9.9 m/sec for 5 minutes and 22 seconds, the film was biaxially stretched simultaneously in the machine direction by 1.01 times and in the transverse direction by 1.06 times, and finally relaxed by 0.97 time, during the passage of the film through the dryer, followed by being taken out from the dryer. The resulting polyimide film had a thickness of 112 μm, a total light transmittance of 90.2%, a YI of 1.80 and a haze of 1.10%, which showed good transparency. The solvent residual ratio thereof was 5.9% by mass.

Step (3-2): The film obtained in the step (3-1) was cut in 40 mm on both edges thereof with a trimming device, and dried by blowing nitrogen containing 1,000 ppm oxygen onto both the upper and lower surfaces of the film at a flow rate of 3.2 m/sec at 175° C. for 2 minutes and 9 seconds, at a flow rate of 4.2 m/sec at 195° C. for 3 minutes and 12 seconds, at a flow rate of 3.6 m/sec at 205° C. for 3 minutes and 45 seconds, at a flow rate of 4.2 m/sec at 205° C. for 3 minutes and 12 seconds, at a flow rate of 3.5 m/sec at 205° C. for 1 minute and 36 seconds, at a flow rate of 3.2 m/sec at 205° C. for 2 minutes and 9 seconds, at a flow rate of 4.2 m/sec at 220° C. for 3 minutes and 12 seconds, at a flow rate of 3.6 m/sec at 240° C. for 3 minutes and 45 seconds, at a flow rate of 4.2 m/sec at 240° C. for 3 minutes and 12 seconds, at a flow rate of 3.5 m/sec at 220° C. for 1 minute and 36 seconds, at a flow rate of 3.2 m/sec at 220° C. for 2 minutes and 9 seconds, at a flow rate of 4.2 m/sec at 260° C. for 3 minutes and 12 seconds, at a flow rate of 3.6 m/sec at 280° C. for 3 minutes and 45 seconds, at a flow rate of 4.2 m/sec at 280° C. for 3 minutes and 12 seconds, and at a flow rate of 3.5 m/sec at 220° C. for 1 minutes and 36 seconds, by using a dryer that dried the film by directly heating the film by far-infrared heating and simultaneously blew nitrogen containing 1,000 ppm oxygen heated by a far-infrared heater. The polyimide film finally obtained had a thickness of 103 µm, a width of 550 mm, a total light transmittance of 90.2%, a YI of 1.82 and a haze of 1.10%, which showed good transparency, and was good in flatness. The solvent residual ratio thereof was 0.9% by mass.

One piece of a film having a dimension of 150 mm×150 mm was cut out from the resulting film, and placed in a vacuum chamber, which was evacuated with a vacuum pump for measuring the vacuum degree attained, and the vacuum degree reached $10^{-5}$ torr ($133\times10^{-5}$ Pa) in 30 minutes. Accordingly, it was found that the film was able to be vacuum deposited.

Example 12

Step (1): The organic solvent solution of the polyimide obtained in Reference Example 2 was extruded from a T-die with a metering pump in a prescribed amount and flow-cast on a rotating stainless steel belt.

Step (2): Subsequently, the flow-cast material was dried for 30 minutes while blowing a mixed gas containing 15% by volume of oxygen and 85% by volume of nitrogen heated to 120° C. onto the flow-cast material at a flow velocity of 6.6 m/sec, and further dried for 30 minutes while blowing a mixed gas containing 15% by volume of oxygen and 85% by volume of nitrogen heated to 130° C. at a flow velocity of 7.4 m/sec, followed by being released from the stainless steel belt, to provide a self-supporting film having a thickness of 60 µm and a width of 630 mm. The self-supporting film had a total light transmittance of 90.2%, a YI (yellow index) of 1.88, a haze of 1.04% and a solvent residual ratio of 16.0% by mass.

Step (3-1): The self-supporting film obtained in the step (2) was passed horizontally through a tenter dryer, and while blowing a mixed gas containing 10% by volume of oxygen and 90% by volume of nitrogen at 160° C. onto the upper surface of the film at a flow velocity of 15 m/sec and onto the lower surface of the film at a flow velocity of 9.9 m/sec for 30 seconds, at 170° C. onto the upper surface of the film at a flow velocity of 15 m/sec and onto the lower surface of the film at a flow velocity of 9.9 m/sec for 1 minute and 10 seconds, and further at 200° C. onto the upper surface of the film at a flow velocity of 15 m/sec and onto the lower surface of the film at a flow velocity of 9.9 m/sec for 5 minutes and 22 seconds, the film was biaxially stretched simultaneously in the machine direction by 1.01 times and in the transverse direction by 1.06 times, and finally relaxed by 0.97 time, during the passage of the film through the dryer, followed by being taken out from the dryer. The resulting polyimide film had a thickness of 112 µm, a total light transmittance of 90.2%, a YI of 1.80 and a haze of 1.10%, which showed good transparency. The solvent residual ratio thereof was 4.9% by mass.

Step (3-2): The film obtained in the step (3-1) was cut in 40 mm on both edges thereof with a trimming device, and dried by blowing nitrogen containing 1,000 ppm oxygen onto both the upper and lower surfaces of the film at a flow rate of 3.2 m/sec at 220° C. for 2 minutes and 9 seconds, at a flow rate of 4.2 m/sec at 260° C. for 3 minutes and 12 seconds, at a flow rate of 3.6 m/sec at 280° C. for 3 minutes and 45 seconds, at a flow rate of 4.2 m/sec at 280° C. for 3 minutes and 12 seconds, and at a flow rate of 3.5 m/sec at 220° C. for 1 minute and 36 seconds, by using a dryer that dried the film by directly heating the film by far-infrared heating and simultaneously blew nitrogen containing 1,000 ppm oxygen heated by a far-infrared heater. The polyimide film finally obtained had a thickness of 103 µm, a width of 550 mm, a total light transmittance of 90.2%, a YI of 1.82 and a haze of 1.10%, which showed good transparency, and was good in flatness. The solvent residual ratio thereof was 0.7% by mass.

One piece of a film having a dimension of 150 mm×150 mm was cut out from the resulting film, and placed in a vacuum chamber, which was evacuated with a vacuum pump for measuring the vacuum degree attained, and the vacuum degree reached $10^{-5}$ torr ($133\times10^{-5}$ Pa) in 30 minutes. Accordingly, it was found that the film was able to be vacuum deposited.

Comparative Example 8

A polyimide film was obtained in the same manner as in Example 11 except that in Example 11, the film was not subjected to the step (3-2).

One piece of a film having a dimension of 150 mm×150 mm was cut out from the resulting film, and placed in a vacuum chamber, which was evacuated with a vacuum pump for measuring the vacuum degree attained, but 1 torr (133 Pa) was not attained after 30 minutes. It was found that the remaining solvent was gradually evaporated to prevent the vacuum degree from being increased, thereby failing vacuum deposition.

Comparative Example 9

A polyimide film was obtained in the same manner as in Example 11 except that in Example 11, the film was not subjected to the step (3-1), and in the step (3-2), the film was dried at 280° C. while blowing nitrogen having an oxygen concentration of 300 ppm at a flow velocity of 3.3 m/sec.

However, the film was elongated in the dryer of a far-infrared heating type and suffered stripes in the machine direction to cause appearance failure.

Comparative Example 10

A polyimide film was obtained in the same manner as in Example 12 except that in Example 12, the film was not subjected to the step (3-2).

One piece of a film having a dimension of 150 mm×150 mm was cut out from the resulting film, and placed in a vacuum chamber, which was evacuated with a vacuum pump for measuring the vacuum degree attained, but 1 torr (133 Pa) was not attained after 30 minutes. It was found that the remaining solvent was gradually evaporated to prevent the vacuum degree from being increased, thereby failing vacuum deposition.

Comparative Example 11

A polyimide film was obtained in the same manner as in Example 11 except that in Example 12, the film was not subjected to the step (3-1), and in the step (3-2), the film was dried at 240° C. while blowing nitrogen having an oxygen concentration of 300 ppm at a flow velocity of 3.3 m/sec.

However, the film was elongated in the dryer of a far-infrared heating type and suffered stripes in the machine direction to cause appearance failure.

Example 13

Step (1): The organic solvent solution of the polyimide obtained in Reference Example 3 was extruded from a T-die with a metering pump in a prescribed amount and flow-cast on a rotating stainless steel belt.

Step (2): Subsequently, the flow-cast material was dried for 50 minutes while blowing a mixed gas containing 15% by volume of oxygen and 85% by volume of nitrogen heated to 110° C. onto the flow-cast material at a flow velocity of 4.3 m/sec, and further dried for 50 minutes while blowing a mixed gas containing 15% by volume of oxygen and 85% by volume of nitrogen heated to 140° C. at a flow velocity of 9.4 m/sec, followed by being released from the stainless steel belt, to provide a self-supporting film having a width of 630 mm and a thickness of 242 μm. The self-supporting film had a total light transmittance of 89.5%, a YI of 2.81, a haze of 1.14% and a solvent residual ratio of 20.0% by mass.

Step (3-1): The self-supporting film obtained in the step (2) was passed horizontally through a tenter dryer, and while blowing a mixed gas containing 10% by volume of oxygen and 90% by volume of nitrogen at 140° C. onto the upper surface of the film at a flow velocity of 15 m/sec and onto the lower surface of the film at a flow velocity of 9.9 m/sec for 4 minutes and 57 seconds, at 200° C. onto the upper surface of the film at a flow velocity of 15 m/sec and onto the lower surface of the film at a flow velocity of 9.9 m/sec for 14 minutes and 6 seconds, and further at 170° C. onto the upper surface of the film at a flow velocity of 15 m/sec and onto the lower surface of the film at a flow velocity of 9.9 m/sec for 2 minutes, the film was biaxially stretched simultaneously in the machine direction by 1.01 times and in the transverse direction by 1.06 times during the passage of the film through the dryer. The resulting polyimide film had a thickness of 216 μm, a total light transmittance of 89.5%, a YI of 2.90 and a haze of 1.17%, which showed good transparency. The solvent residual ratio thereof was 5.8% by mass.

Step (3-2): The film obtained in the step (3-1) was cut in 40 min on both edges thereof with a trimming device, and dried by blowing nitrogen containing 200 ppm oxygen onto both the upper and lower surfaces of the film at a flow rate of 3.2 m/sec at 195° C. for 6 minutes and 27 seconds, at a flow rate of 4.2 m/sec at 205° C. for 9 minutes and 36 seconds, at a flow rate of 3.6 m/sec at 220° C. for 11 minutes and 15 seconds, at a flow rate of 4.2 m/sec at 220° C. for 9 minutes and 36 seconds, at a flow rate of 3.5 m/sec at 220° C. for 4 minutes and 48 seconds, at a flow rate of 3.6 m/sec at 230° C. for 11 minutes and 15 seconds, at a flow rate of 4.2 m/sec at 240° C. for 9 minutes and 36 seconds, and at a flow rate of 3.5 m/sec at 220° C. for 4 minutes and 48 seconds, by using a dryer that dried the film by directly heating the film by far-infrared heating and simultaneously blew nitrogen containing 200 ppm oxygen heated by a far-infrared heater. The polyimide film finally obtained had a thickness of 202 μm, a width of 550 mm, a total light transmittance of 89.5%, a YI of 3.02 and a haze of 1.17%, which showed good transparency, and was good in flatness. The solvent residual ratio thereof was 1.3% by mass.

One piece of a film having a dimension of 150 mm×150 mm was cut out from the resulting film, and placed in a vacuum chamber, which was evacuated with a vacuum pump for measuring the vacuum degree attained, and the vacuum degree reached $10^{-5}$ torr ($133 \times 10^{-5}$ Pa) in 30 minutes. Accordingly, it was found that the film was able to be vacuum deposited.

Comparative Example 12

A polyimide film was obtained in the same manner as in Example 13 except that the air was used in the step (3-1) of Example 13.

However, the film obtained in the step (3-1) had a total light transmittance of 78.5%, a YI of 4.77 and a haze of 1.20%, which showed considerable yellowing.

Comparative Example 13

A polyimide film was obtained in the same manner as in Example 13 except that a mixed gas containing 7% by volume of oxygen and 93% by volume of nitrogen was used in the step (3-2) of Example 13.

However, the film obtained in the step (3-2) had a total light transmittance of 84.5%, a YI of 3.62 and a haze of 1.17%, which showed yellowing of the film.

INDUSTRIAL APPLICABILITY

The colorless transparent resin film obtained in the present invention has considerably high colorless transparency and is excellent in heat resistance and flatness, and the film can be effectively utilized as a transparent substrate, a thin film transistor substrate and a flexible printed circuit substrate of a liquid crystal display device and an organic EL display device, and the like.

The invention claimed is:

1. A method for producing a colorless transparent resin film by a solution flow casting method comprising: flow-casting an organic solvent solution of a polyamic acid or a polyimide on a support; and drying, the method comprising at least the following step (1), step (2) and step (3) in this order:
   (1) a step of flow-casting an organic solvent solution of a polyamic acid or polyamide on a support,
   (2) a step of evaporating the organic solvent while blowing a gas having an oxygen content of from 0.001 to 15% by volume at a temperature of from 100 to 170° C. onto the flow-cast material, and releasing as a self-supporting film from the support, and
   (3) a step of performing the following step (3-1) and step (3-2) in this order:
   (3-1) a step of lowering an amount of residual organic solvent in the self-supporting film while blowing a gas having an oxygen content of 15% by volume or less at a temperature of from 100 to 250° C. onto the film by using at least one dryer of a type of blowing a heated gas, and
   (3-2) a step of lowering an amount of residual organic solvent in the self-supporting film while blowing a gas having an oxygen content of 5% by volume or less at a temperature of from 150 to 400° C. onto the film by using at least one dryer of a type of blowing a heated gas.

2. The method for producing a colorless transparent resin film according to claim 1, wherein the polyimide is a polyimide having a repeating unit represented by the following general formula (I), and the polyamic acid is a polyamic acid having a repeating unit represented by the following general formula (I'):

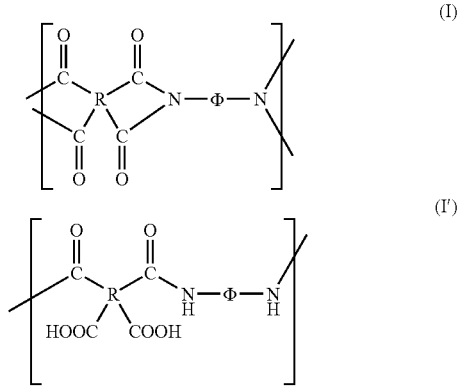

wherein in the formulae, R represents a tetravalent aliphatic hydrocarbon group or a tetravalent alicyclic hydrocarbon group each having from 4 to 39 carbon atoms. Φ represents a divalent aliphatic hydrocarbon group, a divalent alicyclic hydrocarbon group, a divalent aromatic hydrocarbon group or a divalent group containing a combination of these groups, each of which has from 2 to 39 carbon atoms, and may contain as a bonding group at least one group selected from the group consisting of —O—, —SO$_2$—, —CO—, —CH$_2$—, —C(CH$_3$)$_2$—, —OSi(CH$_3$)$_2$—, —C$_2$H$_4$O— and —S—.

3. The method for producing a colorless transparent resin film according to claim 1, wherein the organic solvent is at least one selected from the group consisting of N-methyl-2-pyrrolidone, N,N-dimethylacetamide, γ-butyrolactone, dimethylsulfoxide, hexamethylphosphoramide, tetrahydrothiophene 1,1-dioxide (sulfolane, tetramethylenesulfone), p-chlorophenol, m-cresol, 2-chloro-4-hydroxytoluene, 1,3-dioxolane, cyclohexanone, cyclopentanone, 1,4-dioxane, ε-caprolactam, dichloromethane and chloroform.

4. The method for producing a colorless transparent resin film according to claim 1, wherein in the step (3-1), a gas having a temperature that is higher than a temperature of a gas used lastly in the step (2) by from 1 to 100° C. is used.

5. The method for producing a colorless transparent resin film according to claim 1, wherein in the step (3-2), a gas having a temperature that is higher than a temperature of a gas used lastly in the step (3-1) by from 1 to 100° C. is used.

6. The method for producing a colorless transparent resin film according to claim 1, wherein the dryer used in the step (3-1) is a tenter dryer, the dryer used in the step (3-2) is a dryer of a far-infrared heating system.

7. The method for producing a colorless transparent resin film according to claim 6, wherein in the step (3-1), the film is stretched, simultaneously with drying, by from 1.01 to 6 times in the machine direction and/or the transverse direction.

8. The method for producing a colorless transparent resin film according to claim 1, wherein in the step (2), a flow velocity of the gas blown onto the flow-cast material is from 1 to 36 msec.

9. The method for producing a colorless transparent resin film according to claim 1, wherein in the step (3-1), flow velocities of the gas blown onto an upper surface and a lower surface of the self-supporting film each are from 0.1 to 44 msec.

10. The method for producing a colorless transparent resin film according to claim 9, wherein in the step (3-1), a flow velocity of the gas blown onto a lower surface of the self-supporting film is from 0.3 to 1.1 times a flow velocity of the gas blown onto an upper surface of the film.

11. The method for producing a colorless transparent resin film according to claim 1, wherein in the step (3-2), flow velocities of the gas blown onto an upper surface and a lower surface of the self-supporting film each are from 0.1 to 44 msec.

12. The method for producing a colorless transparent resin film according to claim 1, wherein the support comprises stainless steel.

13. The method for producing a colorless transparent resin film according to claim 1, wherein an amount of residual organic solvent of the self-supporting film is 30% by mass of less after completing the step (2), 15% by mass or less after completing the step (3-1), and 3% by mass or less after completing the step (3-2).

14. The method for producing a colorless transparent resin film according to claim 1, wherein the resulting colorless transparent resin film has a total light transmittance of 88% or more, a YI (yellow index) of 3 or less and a haze of 1.5 or less.

* * * * *